(12) United States Patent
Lee et al.

(10) Patent No.: US 10,134,597 B2
(45) Date of Patent: Nov. 20, 2018

(54) APPARATUSES INCLUDING MEMORY CELLS WITH GAPS COMPRISING LOW DIELECTRIC CONSTANT MATERIALS

(71) Applicant: Micron Technology, Inc., Boise, ID (US)

(72) Inventors: Minsoo Lee, Boise, ID (US); Akira Goda, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/620,458

(22) Filed: Jun. 12, 2017

(65) Prior Publication Data
US 2017/0287719 A1 Oct. 5, 2017

Related U.S. Application Data

(60) Continuation of application No. 15/154,467, filed on May 13, 2016, now Pat. No. 9,679,778, which is a
(Continued)

(51) Int. Cl.
*H01L 21/28* (2006.01)
*H01L 29/66* (2006.01)
(Continued)

(52) U.S. Cl.
CPC .. *H01L 21/28273* (2013.01); *H01L 21/28282* (2013.01); *H01L 21/764* (2013.01);
(Continued)

(58) Field of Classification Search
CPC ......... H01L 27/11521; H01L 21/28273; H01L 21/764; H01L 27/115; H01L 27/11524
See application file for complete search history.

(56) References Cited

U.S. PATENT DOCUMENTS 7,052,967 B2   5/2006  Lee et al.
7,999,304 B2 * 8/2011  Ozawa .............. H01L 21/28273
                                                      257/314
(Continued)

FOREIGN PATENT DOCUMENTS

TW              486773          5/2002

OTHER PUBLICATIONS

Tsukamoto, Keisuke, et al., "Advanced Air Gap Process for Multi-Level-Cell Flash Memories Reducing Threshold Voltage Interference and Realizing High Reliability", Jpn. J. Appl. Phys. 46, (2007), 1.

*Primary Examiner* — Jaehwan Oh
(74) *Attorney, Agent, or Firm* — Schwegman Lundberg & Woessner, P.A.

(57) ABSTRACT

Various embodiments include apparatuses and electronic devices. One such apparatus can include a first dielectric material and a second dielectric material, and a conductive material between the first dielectric material and the second dielectric material. A charge storage element, such as a floating gate or charge trap, is located between the first dielectric material and the second dielectric material and adjacent to the conductive material. The charge storage element has a first surface and a second surface. The first and second surfaces are substantially separated from the first dielectric material and the second dielectric material, respectively, by a first gap and a second gap. In various embodiments, the gaps are air gaps. Additional apparatuses and methods are disclosed.

20 Claims, 6 Drawing Sheets

SECTION H-H

Related U.S. Application Data continuation of application No. 14/825,947, filed on Aug. 13, 2015, now Pat. No. 9,343,316, which is a division of application No. 13/222,367, filed on Aug. 31, 2011, now Pat. No. 9,136,128.

(51) Int. Cl.

| | | |
|---|---|---|
| *H01L 21/764* | (2006.01) | |
| *H01L 29/788* | (2006.01) | |
| *H01L 29/423* | (2006.01) | |
| *H01L 27/11519* | (2017.01) | |
| *H01L 27/11556* | (2017.01) | |
| *H01L 27/11565* | (2017.01) | |
| *H01L 27/11582* | (2017.01) | |

(52) U.S. Cl.
CPC .. *H01L 27/11519* (2013.01); *H01L 27/11556* (2013.01); *H01L 27/11565* (2013.01); *H01L 27/11582* (2013.01); *H01L 29/4234* (2013.01); *H01L 29/42324* (2013.01); *H01L 29/66825* (2013.01); *H01L 29/7889* (2013.01)

(56) References Cited

U.S. PATENT DOCUMENTS

| | | | |
|---|---|---|---|
| 8,034,693 | B2 | 10/2011 | Shibata et al. |
| 8,148,789 | B2 | 4/2012 | Kito et al. |
| 9,136,128 | B2 | 9/2015 | Lee et al. |
| 9,343,316 | B2 | 5/2016 | Lee et al. |
| 9,679,778 | B2 | 6/2017 | Lee et al. |
| 2007/0184615 | A1 | 8/2007 | Brazzelli et al. |
| 2007/0257305 | A1 | 11/2007 | Sasago et al. |
| 2007/0296016 | A1 | 12/2007 | Nagano et al. |
| 2008/0012061 | A1 | 1/2008 | Ichige et al. |
| 2008/0054341 | A1 | 3/2008 | Natori et al. |
| 2008/0197403 | A1 | 8/2008 | Ozawa et al. |
| 2008/0283898 | A1 | 11/2008 | Kuniya |
| 2009/0101883 | A1 | 4/2009 | Lai et al. |
| 2009/0302367 | A1 | 12/2009 | Nagano |
| 2010/0003795 | A1 | 1/2010 | Park et al. |
| 2010/0019311 | A1 | 1/2010 | Sato et al. |
| 2010/0044772 | A1 | 2/2010 | Yonemochi et al. |
| 2010/0176368 | A1 | 7/2010 | Ko et al. |
| 2010/0187593 | A1 | 7/2010 | Morikado |
| 2010/0190330 | A1* | 7/2010 | Yonemochi ....... H01L 21/28273 438/594 |
| 2010/0295113 | A1 | 11/2010 | Kang et al. |
| 2011/0097887 | A1 | 4/2011 | Aoyama et al. |
| 2011/0104883 | A1* | 5/2011 | Nagano ............ H01L 21/28273 438/593 |
| 2011/0108905 | A1* | 5/2011 | Ichige .............. H01L 21/28273 257/316 |
| 2011/0193153 | A1 | 8/2011 | Higuchi et al. |
| 2011/0298013 | A1 | 12/2011 | Hwang et al. |
| 2011/0300703 | A1* | 12/2011 | Sato ................. H01L 21/28273 438/593 |
| 2011/0303967 | A1 | 12/2011 | Harari et al. |
| 2011/0309425 | A1 | 12/2011 | Purayath et al. |
| 2011/0309426 | A1 | 12/2011 | Purayath et al. |
| 2011/0309430 | A1 | 12/2011 | Purayath et al. |
| 2012/0001252 | A1* | 1/2012 | Alsmeier .......... H01L 27/11551 257/321 |
| 2012/0126302 | A1 | 5/2012 | Noda et al. |
| 2012/0213006 | A1 | 8/2012 | Isomura et al. |
| 2012/0256247 | A1* | 10/2012 | Alsmeier .............. H01L 21/764 257/319 |
| 2013/0049093 | A1 | 2/2013 | Lee et al. |
| 2015/0348790 | A1 | 12/2015 | Lee et al. |
| 2016/0254159 | A1 | 9/2016 | Lee |

\* cited by examiner

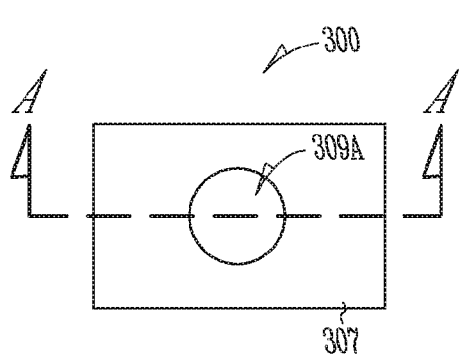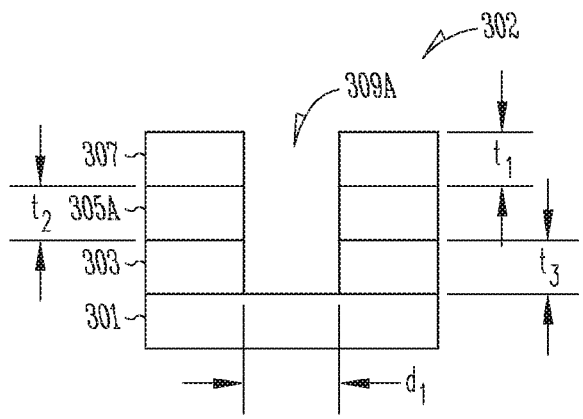
*Fig.3A*  SECTION A-A
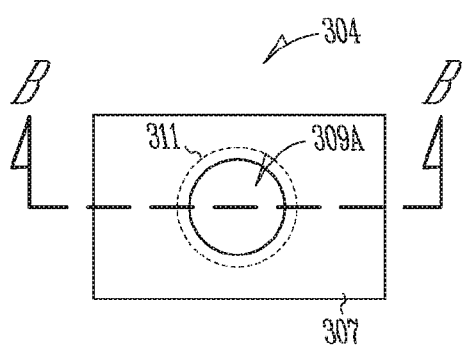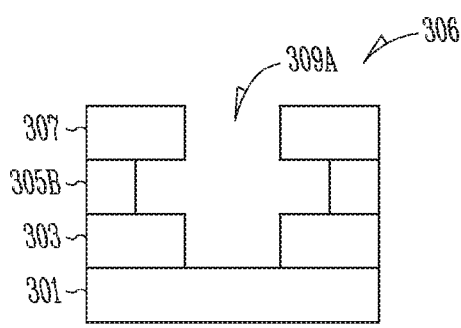
*Fig.3B*  SECTION B-B
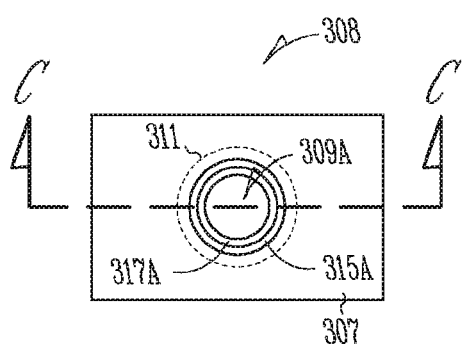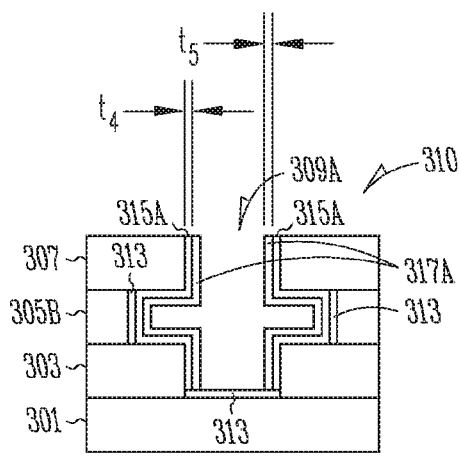
*Fig.3C*  SECTION C-C

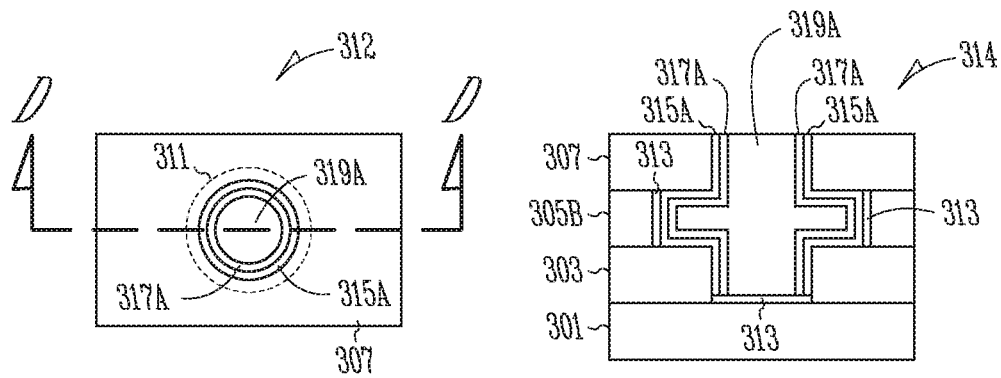
*Fig.3D*      SECTION D-D
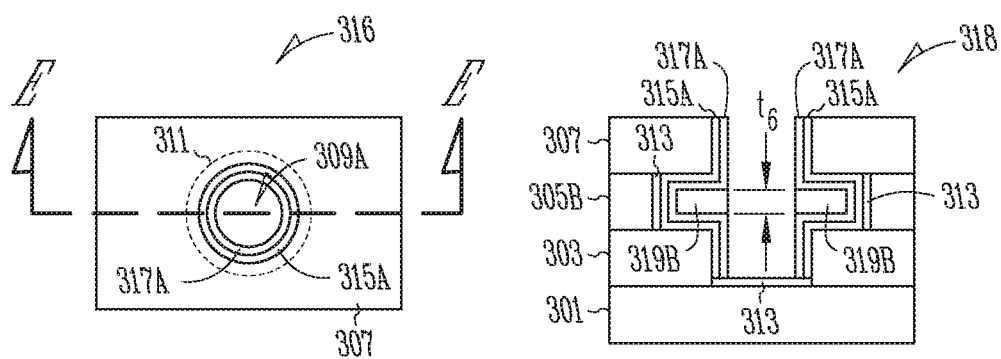
*Fig.3E*      SECTION E-E
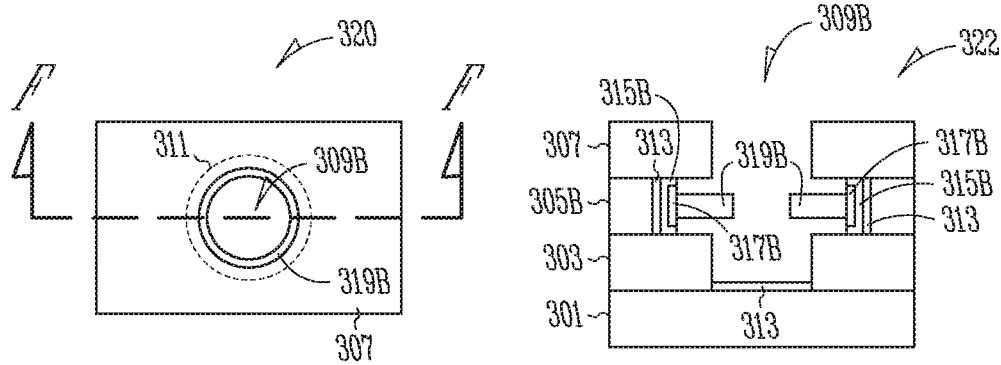
*Fig.3F*      SECTION F-F

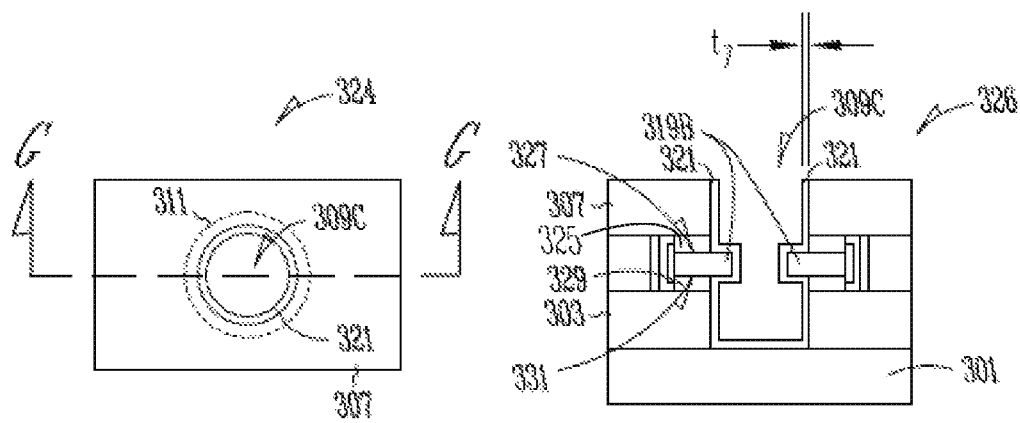
Fig. 3G        SECTION G-G
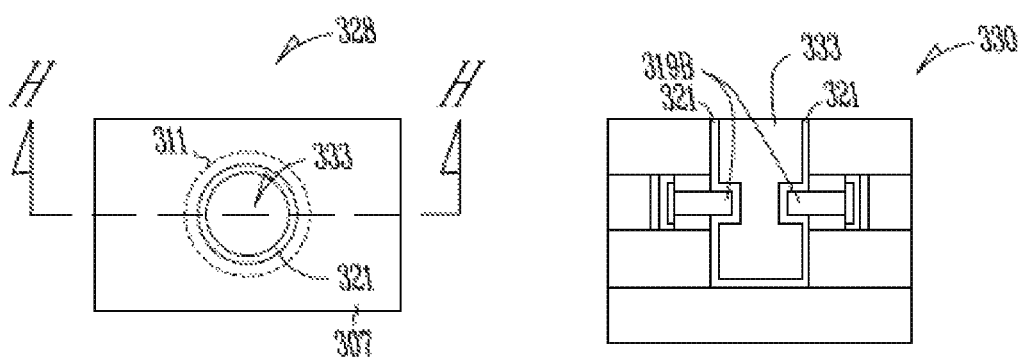
Fig. 3H        SECTION H-H

APPARATUSES INCLUDING MEMORY CELLS WITH GAPS COMPRISING LOW DIELECTRIC CONSTANT MATERIALS

PRIORITY APPLICATION

This application is a continuation of U.S. application Ser. No. 15/154,467, filed May 13, 2016, which is a continuation of U.S. application Ser. No. 14/825,947, filed Aug. 13, 2015, now issued as U.S. Pat. No. 9,343,316, which is a divisional of U.S. application Ser. No. 13/222,367, filed Aug. 31, 2011, now issued as U.S. Pat. No. 9,136,128, all of which are incorporated herein by reference in their entirety.

BACKGROUND

Apparatuses in the form of computers and other electronic products, for example, digital televisions, digital cameras, and cellular phones, often use one or more memory devices to store information. The performance of some memory devices can be degraded by internal parasitic capacitance. In some cases, however, producing the memory devices with reduced internal parasitic capacitance may pose challenges.

BRIEF DESCRIPTION OF THE DRAWINGS

FIGS. 3A through 3H show various portions of a fabrication process to form at least a portion of a memory cell, according to an embodiment.

DETAILED DESCRIPTION

Figure 1:
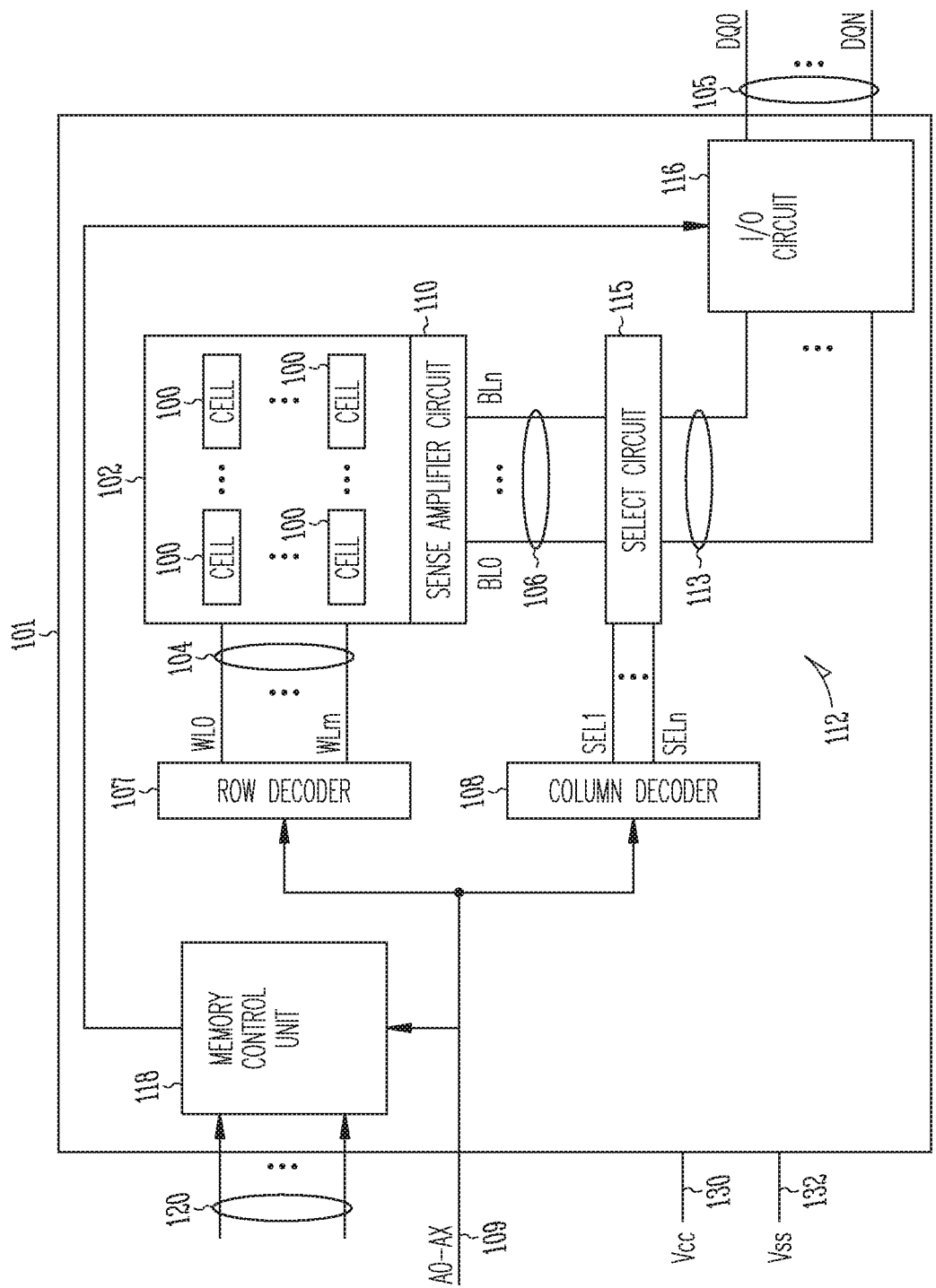
FIG. 1 shows a block diagram of a memory device having a memory array with memory cells, according to an embodiment.

The description that follows includes illustrative apparatuses (circuitry, devices, structures, systems, and the like) and methods (e.g., processes, protocols, sequences, techniques, and technologies) that embody the inventive subject matter. In the following description, for purposes of explanation, numerous specific details are set forth in order to provide an understanding of various embodiments of the inventive subject matter. It will be evident, however, to those skilled in the art that various embodiments of the inventive subject matter may be practiced without these specific details. Further, well-known apparatuses and methods have not been shown in detail.

As used herein, the term "or" may be construed in an inclusive or exclusive sense. Additionally, although various exemplary embodiments discussed below may primarily focus on NAND memory devices including air gaps, the embodiments are merely given for clarity in disclosure, and thus, are not limited to apparatuses in the form of NAND memory devices or even to memory devices in general. As an introduction to the subject, a few embodiments will be described briefly and generally in the following paragraphs, and then a more detailed description, with reference to the figures, will ensue.

A disclosed example method, and a resulting apparatus fabricated by the method, addresses memory cell-to-memory cell interference caused by parasitic capacitance in three-dimensional memory devices. Traditionally, on either side of a charge storage memory element, there are high dielectric constant materials (e.g., silicon dioxide and silicon nitride). Generally, a person of ordinary skill in the art would consider a high dielectric constant to have a value of K greater than about 3.5. Due to the high dielectric constant, parasitic capacitance exacerbates cell-to-cell interference, without enhancing programming performance. In one or more of the embodiments disclosed herein, these otherwise detrimental dielectric films are replaced with, for example, an air gap (or other low dielectric constant material) to reduce the cell-to-cell interference. Such an air gap or other low dielectric constant material can reduce parasitic capacitance since an air gap, for example, has a much lower dielectric constant than the dielectric materials it replaces. Since parasitic capacitance within these devices is often a root-cause problem of cell interference during, for example, program, erase, and read operations of memory devices, operational performance may be significantly improved.

In various embodiments, an apparatus is provided that includes a first dielectric material, a second dielectric material, a conductive material between the first dielectric material and the second dielectric material, and a charge storage element between the first dielectric material and the second dielectric material. The charge storage element is adjacent to the conductive material. The charge storage element has a first surface and a second surface that are substantially separated from the first dielectric material and the second dielectric material, respectively, by a first air gap and a second air gap.

In some embodiments of the apparatus, a third dielectric material is between the conductive material and the charge storage element. Some embodiments further include a tunnel dielectric separating the first air gap and the second air gap from a semiconductor material.

In various embodiments, an apparatus is provided that includes a first dielectric material, a second dielectric material, a conductive material between the first dielectric material and the second dielectric material, and a charge storage element between the first dielectric material and the second dielectric material. The charge storage element is adjacent to the conductive material. The charge storage element has a first surface and a second surface with the first surface being substantially separated from the first dielectric material by a low dielectric constant material. The second surface is substantially separated from the second dielectric material by the low dielectric constant material. The low dielectric constant material has a dielectric constant less than about 3.5.

In some embodiments of the apparatus, the low dielectric constant material comprises air. In some embodiments, the low dielectric constant material is formed substantially without carbon.

In various embodiments, an apparatus is provided that includes a pair of dielectric materials substantially parallel to one another and to a surface of a substrate. A floating gate is between the pair of dielectric materials. The floating gate has a first surface and an opposing second surface. The first surface and the second surface are substantially parallel to and separated from each of the pair of dielectric materials by a first air gap and a second air gap, respectively.

In some embodiments of the apparatus, a tunnel dielectric separates the floating gate, the first air gap, and the second air gap from a semiconductor material.

In various embodiments, a method is provided that includes forming a first dielectric material, forming a second dielectric material, forming a conductive material between the first dielectric material and the second dielectric material, and forming an opening through the first dielectric material, the second dielectric material, and the conductive material. The conductive material is recessed laterally from the opening to form a recessed control gate and to expose portions of the first dielectric material and the second dielectric material. Portions of a third dielectric material are formed over the exposed portions of the first dielectric material and the second dielectric material. A charge storage element is formed between the portions of the third dielectric material and adjacent to the recessed control gate. Portions of the third dielectric material are substantially removed.

In some embodiments of the method, the method further comprises forming portions of a fourth dielectric material over the portions of the third dielectric material. Forming the charge storage element between the portions of the third dielectric material comprises forming the charge storage element between the portions of the third dielectric material and the fourth dielectric material. Substantially removing the portions of the third dielectric material comprises substantially removing the portions of the third dielectric material and the fourth dielectric material.

In various embodiments, a method is provided that includes forming a pair of dielectric materials substantially parallel to one another and to a surface of a substrate, forming a conductive material between the pair of dielectric materials, and forming an opening through the pair of dielectric materials and the conductive material. The conductive material is recessed laterally from the opening to form a recessed control gate. A floating gate is formed between and spaced apart from the pair of dielectric materials by a low dielectric constant material. The low dielectric constant material has a dielectric constant less than about 3.5.

Referring now to FIG. 1, a block diagram of an apparatus in the form of a memory device 101 is shown. The memory device 101 includes a memory array 102 having a number (e.g., one or more) of memory cells 100 according to an embodiment. The memory cells 100 can be arranged in rows and columns along with access lines 104 (e.g., wordlines to conduct signals WL0 through WLm) and first data lines 106 (e.g., bit lines to conduct signals BL0 through BLn). The memory device 101 can use the access lines 104 and the first data lines 106 to transfer information to and from the memory cells 100. A row decoder 107 and a column decoder 108 decode address signals A0 through AX on address lines 109 to determine which ones of the memory cells 100 are to be accessed.

Sense circuitry, such as a sense amplifier circuit 110, operates to determine the value of information read from the memory cells 100 in the form of signals on the first data lines 106. The sense amplifier circuit 110 can also use the signals on the first data lines 106 to determine values of information to be written to the memory cells 100.

The memory device 101 is further shown to include circuitry 112 to transfer information between the memory array 102 and input/output (I/O) lines 105. Signals DQ0 through DQN on the I/O lines 105 can represent information read from or to be written into the memory cells 100. The I/O lines 105 can include nodes within the memory device 101 (or alternatively, pins, solder balls, or other interconnect technologies such as controlled collapse chip connection (C4), or flip chip attach (FCA)) on a package where the memory device 101 resides. Other devices external to the memory device 101 (e.g., a memory controller or a processor, not shown in FIG. 1) can communicate with the memory device 101 through the I/O lines 105, the address lines 109, or the control lines 120.

The memory device 101 can perform memory operations, such as a read operation, to read information from selected ones of the memory cells 100 and a programming operation (also referred to as a write operation) to program (e.g., to write) information into selected ones of the memory cells 100. The memory device 101 can also perform a memory erase operation to clear information from some or all of the memory cells 100.

A memory control unit 118 controls memory operations based on signals on the control lines 120. Examples of the signals on the control lines 120 can include one or more clock signals and other signals to indicate which operation (e.g., a programming or read operation) the memory device 101 can or should perform. Other devices external to the memory device 101 (e.g., a processor or a memory controller) can control the values of the control signals on the control lines 120. Specific combinations of values of the signals on the control lines 120 can produce a command (e.g., a programming or read command) that can cause the memory device 101 to perform a corresponding memory operation (e.g., a program, read, or erase operation).

Each of the memory cells 100 can be programmed to a different one of at least two data states to represent, for example, a value of a single bit or the value of multiple bits such as two, three, four, or a higher number of bits. For example, each of the memory cells 100 can be programmed to one of two data states to represent a binary value of "0" or "1" in a single hit. Such a cell is sometimes called a single level cell.

In another example, each of the memory cells 100 can be programmed to one of more than two data states to represent a value of, for example, multiple bits, such as one of four possible values "00," "01," "10," and "11" for two bits, one of eight possible values "000," "001," "010," "011," "100," "101," "110," and "111" for three bits, or one of another set of values for larger numbers of multiple bits. A cell that can be programmed to more than two data states is sometimes referred to as a multi-level cell (or multi-state cell). Various operations on these types of cells are discussed in more detail, below.

The memory device 101 can receive a supply voltage, including supply voltage signals $V_{cc}$ and $V_{ss}$, on a first supply line 130 and a second supply line 132, respectively. Supply voltage signal $V_{ss}$ can, for example, be at a ground potential (e.g., having a value of approximately zero volts). Supply voltage signal $V_{cc}$ can include an external voltage supplied to the memory device 101 from an external power source such as a battery or alternating-current to direct-current (AC-DC) converter circuitry (not shown in FIG. 1).

The circuitry 112 of the memory device 101 is further shown to include a select circuit 115 and an input/output (I/O) circuit 116. The select circuit 115 can respond to signals SEL1 through SELn to select signals on the first data lines 106 and the second data lines 113 that can represent the information read from or to be programmed into the memory cells 100. The column decoder 108 can selectively activate the SEL1 through SELn signals based on the A0 through AX address signals on the address lines 109. The select circuit 115 can select the signals on the first data lines 106 and the second data lines 113 to provide communication between the memory array 102 and the I/O circuit 116 during read and programming operations.

The memory device 101 may comprise a non-volatile memory device and the memory cells 100 can include non-volatile memory cells such that the memory cells 100 can retain information stored therein when power (e.g., $V_{cc}$, $V_{ss}$, or both) is disconnected from the memory device 101.

Each of the memory cells 100 can include a memory element having material, at least a portion of which can be programmed to a desired data state (e.g., by storing a corresponding amount of charge on a charge storage element, such as a floating gate or charge trap, or by being programmed to a corresponding resistance value). Different data states can thus represent different values of information programmed into each of the memory cells 100.

The memory device 101 can perform a programming operation when it receives (e.g., from an external processor or a memory controller) a programming command and a value of information to be programmed into one or more selected memory cells 100. Based on the value of the information, the memory device 101 can program the selected memory cells to appropriate data states to represent the values of the information to be stored therein.

One of ordinary skill in the art may recognize that the memory device 101 may include other components, at least some of which are discussed herein. However, several of these components are not necessarily shown in the figure, so as not to obscure the various embodiments described. The memory device 101 may include devices and memory cells, and operate using memory operations (e.g., programming and erase operations) similar to or identical to those described below with reference to various other figures and embodiments discussed herein.

Figure 2:
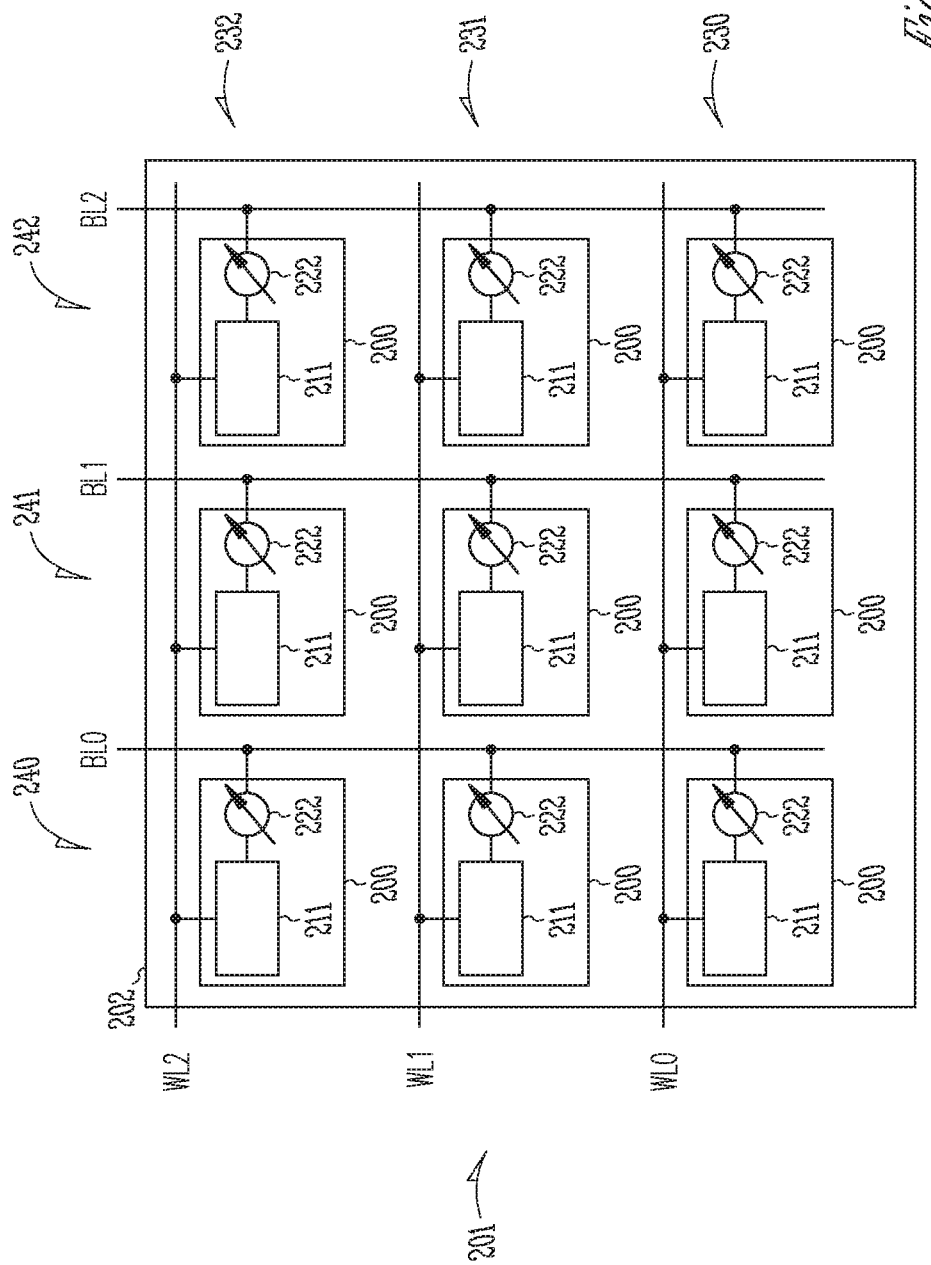
FIG. 2 shows a partial block diagram of a memory device having a memory array including memory cells with access components and memory elements, according to an embodiment.

With reference now to FIG. 2, a partial block diagram of an apparatus in the form of a memory device 201 is shown to include a memory array 202, including memory cells 200 with access components 211 and memory elements 222, according to an example embodiment. The memory array 202 may be similar or identical to the memory array 102 of FIG. 1. As further shown in FIG. 2, the memory cells 200 are shown to be arranged in a number of rows 230, 231, 232, along with access lines, for example word lines, to conduct signals such as signals WL0, WL1, and WL2. The memory cells are also shown to be arranged in a number of columns 240, 241, 242 along with data lines, for example bit lines, to conduct signals such as signals BL0, BL1, and BL2. The access components 211 can turn on (e.g., by using appropriate values of signals WL0, WL1, and WL2) to allow access to the memory elements 222, such as to operate the memory elements as pass elements, or to read information from or program write) information into the memory elements 222.

Programming information into the memory elements 222 can include causing the memory elements 222 to have specific resistance values or, alternatively, to store specific amounts of charge. Thus, reading information from a memory cell 200 can include, for example, determining a resistance value of the memory element 222 or determining whether the memory cell 200 is placed in a conductive state in response to a specific voltage being applied to its access component 211. In either case, such a determining act may involve sensing a current (or absence of current) flowing through the memory cell 200 (e.g., by sensing a current of a bit line electrically coupled to the memory cell). Based on a measured value of the current (including, in some examples, whether a current is detected at all), a corresponding value of the information stored in the memory can be determined. The value of information stored in a memory cell 200 can be determined in still other ways, such as by sensing a voltage of a bit line electrically coupled to the memory cell.

FIGS. 3A through 3H show various portions of a fabrication process to form at least a portion of a memory cell, according to an embodiment. As discussed above, the techniques and fabrication processes described herein can be extended to a number of different apparatuses (e.g., devices). However, fabrication of memory cells will be described below to retain clarity in the discussions that follow. Also, although fabrication of floating gate cells are specifically discussed herein, a person of ordinary skill in the art will recognize, based on the discussions presented herein, that a different charge storage element (e.g., a charge trap) may be fabricated along with or as a substitute for the floating gate.

Each of FIGS. 3A through 3H show both a plan view and a cross-sectional view for additional clarity in understanding the inventive subject matter disclosed herein. Also, although the process below describes only one memory cell being fabricated, the same process can readily be adapted to any number of memory cells formed atop one another in, for example, a stack (e.g., either on top of a substrate or in a trench). For example, a memory device can be formed having a high aspect ratio of feature depth to opening of about 30 to 1 or more. Additionally, although the process below discloses a substantially toroidal-shaped floating gate, a person of ordinary skill in the art can readily adapt this process to a number of feature types upon reading and understanding the disclosure and figures provided herein. For example, the charge storage element can take on a number of different shapes and geometries including substantially square, substantially rectangular, and trench-like structures.

With reference now to FIG. 3A, a plan view 300 illustrates a first dielectric material 307 with an opening 309A etched or otherwise formed therethrough. Various types or material removal processes are known independently in the art to form the opening 309A and may include chemical etchants, ion milling (e.g., a reactive ion etch (RIE), laser ablation, and a number of other processes. The various removal processes can be used independently of one another, or combined in one or more process activities.

A cross-sectional view 302 is shown to include a substrate 301, a second dielectric material 303, and a conductive material 305A. The first dielectric material 307 and the second dielectric material 303 are formed substantially parallel to one another and to a surface of the substrate 301. The first dielectric material 307 and the second dielectric material 303 can each be the same or similar materials in various embodiments. In other embodiments, the first dielectric material 307 and the second dielectric material 303 can be different materials. For example, the various dielectric materials may comprise silicon dioxide ($SiO_2$), silicon nitride ($Si_xN_y$), aluminum oxide ($Al_2O_3$), tantalum pentoxide ($Ta_2O_5$), hafnium oxide ($HfO_2$), or a variety of other organic or inorganic materials. Also, various other combinations of materials may also be substituted or included. Further, one or more of the various materials may include more than one material type.

The substrate 301 can include, for example, any of various substrate types used in the semiconductor and allied industries, which are hereinafter referred to as "semiconductor substrates." Substrate types may therefore include, but are not limited to, silicon wafers, compound wafers, thin film head assemblies, polyethylene-terephthalate (PET) films deposited or otherwise formed with a semiconducting layer (followed by an annealing activity, such as excimer laser annealing (ELA) in some embodiments), or numerous other types of substrates known independently in the art. Also, the substrate 301 may comprise a region of a semiconductor material formed over a non-semiconductor material, or vice-versa. For ease of understanding the fabrication activities that follow, the substrate 301 may be considered to be a silicon wafer. Upon reading and understanding the disclosure provided herein, a person of ordinary skill in the art will understand how to modify the fabrication activities to account for other types of materials and apparatuses.

The conductive material 305A may be, for example, any of a number of types of conductively doped single-crystal or amorphous semiconductor materials. For example, the conductive material 305A may be a conductively doped epitaxial deposition of silicon, other elemental semiconductor, or compound semiconductor. In other examples, the conductive material 305A may be a conductively doped polysilicon material formed by, for example, thermal decomposition or pyrolysis of silane such a low-pressure chemical vapor deposition (LPCVD) process. Other techniques known independently in the art, such as DC sputtering, followed by a post-anneal activity in some embodiments, may also be utilized. In an example, the conductive material 305A is used to form a control gate of a memory cell.

In a specific example, a width of the opening 309A, e.g., a diameter, $d_1$, of the opening, may be about 60 nm. A thickness, $t_1$, of the first dielectric material 307 and a thickness, $t_3$, of the second dielectric material 303 may be about 200 Å each, and a thickness, $t_2$, of the conductive material 305A can be about 300 Å. Thus, a ratio of the thickness, $t_2$, of the conductive material 305A to the thickness, $t_1$ or $t_2$, of the first dielectric material 307 or the second dielectric material 303 may be about 1.5 to 1. A ratio of the width (e.g., diameter, $d_1$) of the opening 309A to the thickness, $t_2$, of the conductive material 305A may be about 2 to 1. The dimensions and ratios provided throughout this disclosure are by way of example only and are merely provided as an aid in further describing the fabrication process. Each of the dimensions can be varied considerably from the examples given depending upon factors such as the apparatus being fabricated or the design rules employed.

In FIG. 3B, a plan view 304 illustrates an undercut region 311. The cross-sectional view 306 illustrates how the conductive material 305A (FIG. 3A) has been recessed (e.g., etched or otherwise stepped back) laterally (e.g., radially) from the opening 309A to form a recessed control gate 305B and to expose portions of the first dielectric material 307 and the second dielectric material 303. The conductive material 305A may be recessed (e.g., stepped back) by various means such as an anisotropic or isotropic wet etch. For example, the recessed control gate 305B may be formed by various types of chemical anisotropic etchants (e.g., tetramethyl ammonium hydroxide (TMAH)). If potassium contamination is not a concern for a particular device type being fabricated, etchants such as such as potassium hydroxide (KOH) may be used as well. Additionally, other chemical etchants may be used for an anisotropic silicon etch. In addition to TMAH and KOH, ethylene-diamene-pyrocatechol (EDP) may also be an effective etchant. As noted, isotropic etchants may also be employed for various types of devices. For example, a hydrofluoric/nitric/acetic (HNA) acid chemical etchant may be used for certain apparatuses or design rules.

Depending upon the material composition of the substrate 301, some of these chemical etchants may also be used to etch at least a portion of the substrate 301. However, the substrate can be protected in various ways such as, for example, forming a barrier region over the substrate 301 prior to forming the second dielectric material. For example, if the first dielectric material 307 and the second dielectric material 303 are each silicon dioxide, a silicon nitride region may first be formed over the substrate 301. When the opening 309A is formed, a selective etchant can be chosen that etches silicon dioxide faster than silicon nitride. Consequently, formation of the opening 309A may use the silicon nitride material formed over the substrate 301 as an etch stop. Alternatively or in addition to forming the silicon nitride region over the substrate 301, the substrate 301 may also have a lattice orientation that is more resistant to chemical etching by TMAH, KOH, or other chemical etchants. For example, using a silicon substrate with a <110> or <101> lattice orientation results in relatively low etch rates with these etchants.

With concurrent reference now to the plan view 308 and the cross-sectional view 310 of FIG. 3C, a silicon dioxide material 313 is thermally grown, the formation of which partially consumes exposed portions of the recessed control gate 305B. Also, assuming the substrate 301 comprises silicon, the silicon dioxide material 313 also partially consumes exposed portions of the substrate 301. Although a person of ordinary skill in the art will recognize that other types of dielectric material can be substituted for the silicon dioxide material 313, thermally growing the silicon dioxide material 313 readily forms a dielectric layer over the exposed portions of the recessed control gate 305B.

A third dielectric material 315A is then formed in the opening 309A over exposed portions of the first dielectric material 307 and the second dielectric material 303, followed by forming a fourth dielectric material 317A in the opening 309A and over the third dielectric material 315A. Although the third dielectric material 315A and the fourth dielectric material 317A may comprise the same material, there may be advantages to the third dielectric material 315A and the fourth dielectric material 317A being different materials. One advantage may be realized in forming the material as discussed in more detail, by way of example, below with reference to FIG. 3F. Another advantage may arise during less rigorous material removal (e.g., etching) activities that follow. For example, by using different materials, the third dielectric material 315A can act as an etch stop for the fourth dielectric material 317A. Therefore, there may be fewer, if any, critical timing activities involved in the fabrication process. Additionally, in some embodiments, the third dielectric material 315A comprises one or more different materials than the first dielectric material 307 and the second dielectric material 303, such as for at least the same reasons as discussed above with reference to material selection of the third dielectric material 315A and the fourth dielectric material 317A.

In a specific example, the third dielectric material 315A may be silicon nitride and the fourth dielectric material 317A may be silicon dioxide. The third dielectric material 315A may, for example, be a conformally deposited silicon nitride. The fourth dielectric material 317A may, for example, be a thermally grown silicon dioxide material formed over the silicon nitride. Continuing with this specific example, the silicon dioxide material 313 and the third dielectric material 315A may each be formed to a thickness, $t_4$, of about 80 Å. The fourth dielectric material 317A may be formed to a thickness, $t_5$, of about 90 Å. However, as noted above, these dimensions are by way of example only, used as an aid in understanding the fabrication processes described herein.

In FIG. 3D, a plan view 312 and a cross-sectional view 314 are both shown to include a charge storage element material, such as a semiconductor material 319A, formed in the opening 309A. The semiconductor material 319A at least partially fills the opening 309A (FIGS. 3A through 3C).

Although the semiconductor material 319A is shown to fill the opening 309A, a person of ordinary skill in the art will recognize, upon reading and understanding the information disclosed herein, that the semiconductor material 319A may only partially fill the opening 309A. Additionally, the semiconductor material 319A may overfill the opening 309A.

The semiconductor material 319A may comprise, for example, any of a number of types of single-crystal or amorphous semiconductor materials. For example, the semiconductor material 319A may be an epitaxial deposition of silicon, other elemental semiconductors, or compound semiconductors. In other examples, the semiconductor material 319A may be a conductively-doped polysilicon material. A selection of material may be partially dependent upon chosen removal (e.g., etching) activities that follow. Further discussion on a choice of material is given below, by way of example, with reference to FIG. 3E.

Referring now to FIG. 3E, a plan view 316 illustrates that at least a portion of the semiconductor material 319A (FIG. 3D) has been removed to form a second opening. The cross-sectional view 318 provides additional detail on the second opening. The semiconductor material 319A has been partially removed, forming a floating gate 319B between portions of the third dielectric material 315A (and in some cases, such as in the embodiment illustrated in FIG. 3E, portions of the fourth dielectric) covering portions of the first dielectric material 307 and the second dielectric materials 303 that had been exposed during the formation of the recessed control gate 305B. Although not required, the floating gate 319B is shown in FIG. 3E to have substantially vertical sidewalls, and to have an outer periphery substantially surrounded by the recessed control gate 305B. To form the vertical sidewalls, the removed portion of the semiconductor material 319A may have been, for example, etched by one or more of the various processes discussed above. For example, if the semiconductor material 319A is a single crystalline material, the removed portion may have been etched by TMAH or KOH, depending upon an orientation of the lattice structure (e.g., <100> or <111>). If the semiconductor material 319A is an amorphous semiconductor material, a substantially vertical sidewall etch can be performed by an RIE process. Each of these chemical processes can be achieved using a selective etchant to remove portions of the semiconductor material 319A while leaving surrounding dielectric materials in place. In a specific example, a thickness, $t_6$, of the floating gate 319B may be about 140 Å.

In the fabrication sequence given by way of example in FIGS. 3A through 3G, the process is disclosed as forming a substantially toroidal-shaped floating gate. In mathematics, a toroidal-shaped feature may resemble a self-enclosing or doughnut-shaped object. Generally, the annular shape of a toroid may be generated by revolving a plane geometrical figure about an axis external to the geometrical figure, where the axis is parallel to the plane of the figure and does not intersect the figure. For example, when a rectangle is rotated around an axis parallel and separated from one of the edges of the rectangle, then a hollow ring-shaped feature, having a rectangular cross-section, is formed. Thus, the cross-sectional view 318 of FIG. 3E is shown to include a cross-sectional edge of the floating gate 319B. In this example, the floating gate 319B is a toroidal-shaped feature having a substantially rectangular cross-section. However, as discussed above, the floating gate 319B, fabricated in this example to resemble a toroid with a rectangular cross-sectional, can take on a variety of shapes. For example, the cross-section may be circular, ovoid, square, stadium-shaped, or elliptical. Also, the fabrication techniques disclosed herein can also be used to fabricate non-enclosing features. For example, a circular, rectangular, or square feature can be considered to be an enclosing feature since it may be bounded on all sides. However, a trench may, in some embodiments, be open on two ends (e.g., an aspect ratio of the length to width of the trench may be high such that the ends are effectively open or the ends may actually be open). Thus, a trench may formed having air gaps.

In FIG. 3F, a plan view 320 illustrates that portions of the third dielectric material 315A and the fourth dielectric material 317A have been substantially removed (which, in at least some embodiments, may mean that the portions have been completely removed). Consequently, the floating gate 319B is now visible from the plan view 320. Also, the plan view 320 of FIG. 3F is shown to now include a third opening 309B. An outer periphery of the third opening 309B is defined by an area surrounded by the floating gate 3199.

Again, as indicated by the cross-sectional view 322 of FIG. 3F, portions of the third dielectric material 315A and the fourth dielectric material 317A have been removed. The third dielectric material 315A and the fourth dielectric material 317A may each have a high dielectric constant. If the removed portions were left in place, the high dielectric constant may cause device performance degradation due to parasitic capacitances of these dielectric materials. Further, in typical floating gate memory cell construction, the floating gate memory cells may have an interference effect from neighboring cells, also caused by the parasitic capacitances. Therefore, by removing the portions of the third dielectric material 315A and the fourth dielectric material 317A on either side of the floating gate 319B, parasitic capacitance effects, and the resulting device degradation, can be reduced or eliminated. Portions of the third dielectric material 315A and the fourth dielectric material 317A may be removed by, for example, any of the dielectric etchant chemicals discussed, above.

For example, if the third dielectric material 315A and the fourth dielectric material 317A were comprised of silicon nitride and silicon dioxide, respectively, then a silicon dioxide etchant may be used to remove portions of the fourth dielectric material 317A. A silicon nitride etchant may be used to remove portions of the third dielectric material 315A. Since each of these dielectric material etchants are generally highly selective with reference to dielectric to semiconductor etching rates, neither etchant should appreciably affect the floating gate 319B. In the example provided above, where the floating gate 319B is toroidal-shaped (e.g., a toroidal-shaped floating gate), a remaining portion of the third dielectric material 315A (i.e., a first dielectric base portion 315B) and a remaining portion of the fourth dielectric material 317A (i.e., a second dielectric base portion 317B) are located between an outer periphery of the floating gate 319B and an inner periphery of the recessed control gate 305B. The first dielectric base portion 315B and the second dielectric base portion 317B may serve to, at least in part, secure the floating gate 319B to the recessed control gate 305B (e.g., to otherwise prevent toppling of the floating gate 319B).

With reference now to FIG. 3G, a plan view 324 is shown to include a tunnel dielectric 321 and a fourth opening 309C. As illustrated by a cross-sectional view 326, the fourth opening 309C has a reduced width (e.g., diameter) relative to the third opening (FIG. 3F) due to the tunnel dielectric 321 being formed in the third opening 309B and therefore over a sidewall of the floating gate 319B. An outer periphery of the fourth opening 309C is defined by an area surrounded by the tunnel dielectric 321.

The tunnel dielectric 321 is formed over exposed portions of the substrate 301, and sidewalk of the first dielectric material 307, the second dielectric material 303, and the floating gate 319B. However, as illustrated, the tunnel dielectric 321 is generally unable to fill the gaps left by removed portions of the third dielectric material 315A and the fourth dielectric material 317A (see FIG. 3E). Thus, a first air gap 325 is formed separating a first surface 327 of the floating gate 319B from the first dielectric material 307, and a second air gap 329 is formed separating a second surface 331 of the floating gate 319B from the second dielectric material 303. As illustrated, the first surface 327 and the second surface 331 may be opposing surfaces. The first surface 327 and the second surface 331 may also be substantially parallel to surfaces of the first dielectric material 307 and the second dielectric material 303, respectively. The tunnel dielectric 321 may be considered to be formed over the first air gap 325 and the second air gap 329.

In a specific example, the tunnel dielectric 321 may be deposited or otherwise formed to have a thickness, $t_7$, of about 30 Å to about 70 Å. Thus, a ratio of the thickness, $t_2$, of the conductive material 305A (FIG. 3A) to the thickness, $t_7$, of the tunnel dielectric 321 may be from about 10 to 1 to about 4 to 1, or in some embodiments, about 10 to 1 to about 4.2 to 1. The tunnel dielectric 321 may be a silicon dioxide material, for example, deposited by a number of techniques known independently by a person of ordinary skill in the art such as, for example, high temperature oxidation (HTO) techniques.

Referring now to FIG. 3H, a plan view 328 and a cross-sectional view 330 is shown to include a semiconductor material 333 that may then be formed in the fourth opening 309C (FIG. 3G). The semiconductor material 333 may be used as a channel for a string of memory cells, including the memory cell that includes the depicted charge storage element (e.g., the floating gate 319B). Accordingly, the tunnel dielectric 321 may separate the semiconductor material front the charge storage element (e.g., the floating gate 319B). The tunnel dielectric 321 may also separate the first air gap 325 and the second air gap 329 from the semiconductor material 333. A person of ordinary skill in the art, upon reading and understanding the disclosure provide herein, can readily understand how to apply at least ones of the various embodiments to multiple levels of memory cells.

Since the dielectric constant of air is substantially less than most dielectric materials, an overall parasitic capacitance level of air is less than most dielectric materials. For example, the dielectric constant of silicon dioxide, at about 3.9, is considered to be a high dielectric constant (high-k) material. Thus, the dielectric constant of silicon dioxide is about four times higher than the dielectric constant of air (the dielectric constant of air is about 1.0005). Consequently, the likelihood of degrading parasitic capacitance effects within various memory structures is much higher when silicon dioxide is used, rather than with air. As noted above, parasitic capacitances are a major source of cell-to-cell interference during program, erase, and read operations of memory cells.

In another example, prior to forming the tunnel dielectric 321, the air gaps may be filled with a low dielectric constant (low-k) material. According to at least one embodiment, a low dielectric constant material may comprise a material having a dielectric constant less than about 3.5. Low-k materials are known independently to a person of ordinary skill in the art and may include materials such as fluorine-doped silicon dioxide, carbon-doped silicon dioxide, porous silicon dioxide, and various spin-on organic polymer dielectric materials. However, each of these materials only provides an approximately 10% to 45% reduction from the dielectric constant of silicon dioxide. For example, one carbon-doped silicon dioxide used in industry is known as Black Diamond® 3 material and has a dielectric constant of about 2.2. Black Diamond® 3 material is produced by Applied Materials, Inc. of Santa Clara, Calif., U.S.A. Consequently, each of these materials will still exhibit a higher parasitic capacitance level than air, due to the higher dielectric constant.

Although the process activities may refer to particular dielectric materials, such as silicon dioxide, silicon nitride, or others, a person of ordinary skill in the art, after reading this disclosure, will recognize that other dielectric materials may be substituted and still be within a scope of the inventive subject matter. Thus, the material choices and selections presented as an example, and an aid in understanding one example of a fabrication process.

Figure 4:
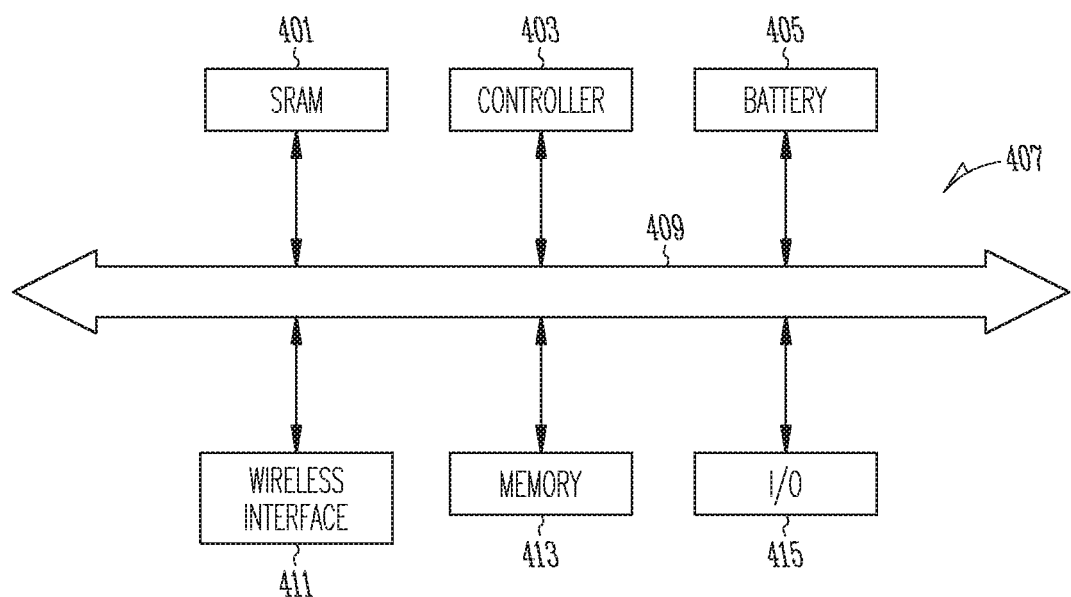
FIG. 4 shows a block diagram of a system embodiment, including a memory device.

With reference now to FIG. 4, a block diagram of an illustrative embodiment of an apparatus in the form of a system 407 including one or more memory devices (e.g., the memory device 101 of FIG. 1) is shown. The system 407 may be used in devices such as, for example, a personal digital assistant (PDA), a laptop or portable computer with or without wireless capability, a web tablet, a wireless telephone, a pager, an instant messaging device, a digital music player, a digital camera, or other devices that may be adapted to transmit or receive information either wirelessly or over a wired connection. The system 407 may be used in any of the following systems: a wireless local area network (WLAN) system, a wireless personal area network (WPAN) system, or a cellular network.

The system 407 of FIG. 4 is shown to include a controller 403, an input/output (I/O) device 415 (e.g., a keypad, a touchscreen, or a display), the memory device 101 of FIG. 1, a wireless interface 411, and a static random access memory (SRAM) device 401 coupled to each other via a bus 409. A battery 405 may supply power to the system 407 in one embodiment. The memory device 101 may include a NAND memory, a flash memory, a NOR memory, a combination of these, or the like.

The controller 403 may include, for example, one or more microprocessors, digital signal processors, micro-controllers, or the like. The memory device 101 may be used to store messages transmitted to or by the system 407. The memory device 101 may optionally also be used to store instructions that are executed by the controller 403 during operation of the system 407 and may be used to store user data either generated, collected, or received by the system 407 (such as image data). The instructions may be stored as digital information and the user data, as disclosed herein, may be stored in one section of the memory as digital data and in another section as analog memory. As another example, a given section at one time may be labeled to store digital information and then later may be relabeled and reconfigured to store analog information.

The I/O device 415 may be used to generate a message. The system 407 may use the wireless interface 411 to transmit and receive messages to and from a wireless communication network with a radio frequency (RF) signal. Examples of the wireless interface 411 may include an antenna, or a wireless transceiver, such as a dipole antenna. However, the scope of the inventive subject matter is not limited in this respect. Also, the I/O device 415 may deliver a voltage reflecting what is stored as either a digital output (if digital information was stored), or as analog information (if analog information was stored). While an example in a wireless application is provided above, embodiments of the inventive subject matter disclosed herein may also be used in non-wireless applications as well.

The various illustrations of apparatus (e.g., the memory device 101 and examples of the various fabrication stages illustrated with reference FIGS. 5 through 5K) are intended to provide a general understanding of the structure of various embodiments and are not intended to provide a complete description of all the elements and features of the apparatus that might make use of the structures, features, and materials described herein.

The apparatus of the various embodiments may include or be included in, for example, electronic circuitry used in high-speed computers, communication and signal processing circuitry, single or multi-processor modules, single or multiple embedded processors, multi-core processors, data switches, and application-specific modules including multilayer, multi-chip modules, or the like. Such apparatuses may further be included as sub-components within a variety of electronic systems, such as televisions, cellular telephones, personal computers (e.g., laptop computers, desktop computers, handheld computers, tablet computers, etc.), workstations, radios, video players, audio players, vehicles, medical devices (e.g., heart monitors, blood pressure monitors, etc.), set top boxes, and various other electronic systems.

One of ordinary skill in the art will appreciate that, for this and other methods disclosed herein, the activities forming part of various methods may be implemented in a differing order, as well as repeated, executed simultaneously, or substituted one for another. Further, the outlined acts and operations are only provided as examples, and some of the acts and operations may be optional, combined into fewer acts and operations, or expanded into additional acts and operations without detracting from the essence of the disclosed embodiments.

The present disclosure is therefore not to be limited in terms of the particular embodiments described in this application, which are intended as illustrations of various aspects. For example, instead of using floating gates as a charge storage element, charge traps may be used instead. Many modifications and variations can be made, as will be apparent to a person of ordinary skill in the art upon reading and understanding the disclosure. Functionally equivalent methods and apparatuses within the scope of the disclosure, in addition to those enumerated herein, will be apparent to a person of ordinary skill in the art from the foregoing descriptions. Portions and features of some embodiments may be included in, or substituted for, those of others. Many other embodiments will be apparent to those of ordinary skill in the art upon reading and understanding the description provided herein. Such modifications and variations are intended to fall within a scope of the appended claims. The present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to comply with 37 C.F.R. § 1.72(b), requiring an abstract allowing the reader to quickly ascertain the nature of the technical disclosure. The abstract is submitted with the understanding that it will not be used to interpret or limit the claims. In addition, in the foregoing Detailed Description, it may be seen that various features are grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

What is claimed is:

1. An electronic device, comprising:
a pair of dielectric materials located substantially parallel to one another; and
a charge storage material disposed substantially between the pair of dielectric materials and having a first surface and an opposing second surface, the first surface and the second surface being substantially parallel to and separated from each of the pair of dielectric materials by a first gap and a second gap, respectively, that are in contact with the first surface and the opposing second surface, respectively, of the charge storage material, each gap being filled with a low-dielectric-constant material.

2. The electronic device of claim 1, wherein the low-dielectric-constant material comprises air.

3. The electronic device of claim 1, wherein the low-dielectric-constant material comprises a gas.

4. The electronic device of claim 1, wherein the first dielectric material and the second dielectric material are comprised of the same material.

5. The electronic device of claim 1, wherein the first dielectric material and the second dielectric material are comprised of different materials.

6. The electronic device of claim 1, further comprising a third dielectric material between the conductive material and the charge storage material.

7. The electronic device of claim 6, wherein the third dielectric material comprises silicon dioxide and silicon nitride.

8. An apparatus comprising:
a first dielectric material;
a second dielectric material;
a conductive material located between the first dielectric material and the second dielectric material; and
a charge storage element located substantially between the first dielectric material and the second dielectric material and further being located adjacent to the conductive material, the charge storage element having a first surface and a second surface, the first surface and the second surface being substantially separated electrically from the first dielectric material and the second dielectric material, respectively, by a first gap and a second gap that are in contact with the first surface and the second surface, respectively, of the charge storage element.

9. The apparatus of claim 8, wherein the charge storage element comprises a substantially toroidal-shaped floating gate that is substantially circular.

10. The apparatus of claim 8, wherein the apparatus includes a memory device comprising the first dielectric material, the second dielectric material, the conductive material, and the charge storage element.

11. The apparatus of claim 10, wherein the apparatus further comprises a controller coupled to the memory device.

12. The apparatus of claim 8, further comprising a tunnel dielectric separating the first gap and the second gap from a semiconductor material.

13. The apparatus of claim 12, wherein a ratio of a thickness of the conductive material to a thickness of the tunnel dielectric may be from about 10 to 1 to about 4 to 1.

14. An apparatus comprising:
a pair of dielectric materials located substantially parallel to one another;
a conductive material located between the pair of dielectric materials; and
a charge storage element configured to store charge to represent a data state, the charge storage element located substantially between the pair of dielectric materials and adjacent to the conductive material, the charge storage element having a first surface and a second surface, the first surface being substantially separated from a first dielectric material by a low dielectric constant material, and the second surface being substantially separated electrically from a second dielectric material by the low dielectric constant material, the low dielectric constant material comprising a gap, the low dielectric constant material substantially contacting the first surface and the second surface, respectively, of the charge storage element.

15. The apparatus of claim 14, wherein the conductive material substantially surrounds an outer periphery of the charge storage element.

16. The apparatus of claim 14, wherein the charge storage element comprises a toroidal-shaped floating gate.

17. The apparatus of claim 16, wherein a cross-section of the toroidal-shaped floating gate is substantially rectangular.

18. The apparatus of claim 16, wherein a cross-section of the toroidal-shaped floating gate is substantially square.

19. The apparatus of claim 16, wherein the gap is configured to reduce a parasitic capacitance between the toroidal-shaped floating gate and a control gate to a level lower than a parasitic capacitance of a gap formed from a high-k dielectric.

20. The apparatus of claim 14, further comprising a dielectric material between an outer periphery of the charge storage element and an inner periphery of the conductive material.

* * * * *